US006460173B1

(12) United States Patent
Schreiber (10) Patent No.: US 6,460,173 B1
(45) Date of Patent: Oct. 1, 2002

(54) FUNCTION UNIT ALLOCATION IN PROCESSOR DESIGN

(75) Inventor: Robert S. Schreiber, Palo Alto, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/378,431

(22) Filed: Aug. 20, 1999

(51) Int. Cl.[7] ............................................. G06F 17/50
(52) U.S. Cl. ................................. 716/18; 716/7; 716/2
(58) Field of Search ........................................ 716/1–21

(56) References Cited

U.S. PATENT DOCUMENTS

| | | | | |
|---|---|---|---|---|
| 6,086,628 A | * | 7/2000 | Dave et al. | 716/7 |
| 6,097,886 A | * | 8/2000 | Dave et al. | 703/23 |
| 6,110,220 A | * | 8/2000 | Dave et al. | 716/3 |
| 6,112,023 A | * | 8/2000 | Dave et al. | 703/27 |
| 6,178,542 B1 | * | 1/2001 | Dave | 716/18 |
| 6,226,776 B1 | | 5/2001 | Panchul | 716/3 |
| 6,230,303 B1 | * | 5/2001 | Dave | 716/7 |
| 6,289,488 B1 | * | 9/2001 | Dave et al. | 716/1 |

OTHER PUBLICATIONS

Ito et al. ("ILP–Based Cost–Optimal DSP Synthesis with Module Selection and Data Format Conversion", IEEE Transactions on Very Large Scale Integration (VLSI) Systems, vol. 6, No. 4, Dec. 1998).*

Wolf ("An Architectural Co–Synthesis Algorithm for Distributed, Embedded Computing Systems", IEEE Transactions on Very Large Scale Integration (VLSI) Systems, vol. 5, No. 2, Jun. 1997, pp. 218–229).*

Shehata et al. ("Performance optimization and system clock determination for synthesis of DSP cores targeting FPGAs", Proceedings of the Ninth IEEE International ASIC Conference and Exhibit, Sep. 23, 1996, pp. 151–154).*

Chang et al. ("Loop–list scheduling for heterogeneous functional units", Proceedings of the Sixth Great Lakes Symposium on VLSI, Mar. 22, 1996, pp. 2–7).*

Theis et al.("POM: a processor model for image processing", Proceedings of 1995 IEEE International Conference on Computer Design: VLSI in Computers and Processors, Oct. 2, 1995, pp. 326–331).*

Orailoglu et al. (Coactive scheduling and checkpoint determination during high level synthesis of self–recovering microarchitectures, IEEE Transactions on Very Large Scale Integration (VLSI) Systems, vol. 2, No. 3, Sep. 1994, pp. 304–311).*

(List continued on next page.)

*Primary Examiner*—Matthew Smith
*Assistant Examiner*—Phallaka Kik (57) ABSTRACT

Methods and apparatus are described for selecting operation devices or hardware components for a processor, such as an embedded processor having pipelined data paths. The process may include identifying a set of hardware components, such as function units, and a plurality of characteristics for those hardware components. A first set of characteristics may include the ability to add, subtract, multiply, and the like, or they may be multi-functional. A second set of characteristics for the hardware components may include cost, throughput and the like. A plurality of these characteristics of the hardware components are incorporated into an algorithm, which is then solved for one or more desired parameters, such as type and number of hardware components. In one preferred embodiment, the least cost assembly of hardware components is found for carrying out a set of computations defined by an algorithm to be executed on the processor according to a preferred initiation interval.

21 Claims, 5 Drawing Sheets

OTHER PUBLICATIONS

Jiang et al. ("Performance–driven interconnection optimization for microarchitecture synthesis", IEEE Transactions on Computer–Aided Design of Integrated Circuits and Systems, vol. 13, No. 2, Feb. 1994, pp. 137–149).*

Wilson et al. ("An ILP solution for simultaneous scheduling, allocation, and binding in multiple block synthesis", IEEE International Conference on Computer Design: VLSI in Computers and Processors, Oct. 10, 1994, pp. 581–586).*

Eles et al. ("Process scheduling for performance estimation and synthesis of hardware/software systems", Proceedings of 24th Euromicro Conference, vol. 1, Aug. 25, 1998, pp. 168–175).*

* cited by examiner

FUNCTION UNIT ALLOCATION IN PROCESSOR DESIGN

RELATED APPLICATION DATA

This patent application is related to the following co-pending U.S. Patent applications, commonly assigned and filed concurrently with this application:

U.S. patent application Ser. No. 09/378,298, entitled PROGRAMMATIC SYNTHESIS OF PROCESSOR ELEMENT ARRAYS, by Robert S. Schreiber, Bantwal Ramakrishna Rau, Shail Aditya Gupta, Vinod Kumar Kathail, and Sadun Anik;

U.S. patent application Ser. No. 09/378,295 entitled INTERCONNECT MINIMIZATION IN PROCESSOR DESIGN, by Robert S. Schreiber.

These patent applications are hereby incorporated by reference.

FIELD OF THE INVENTIONS

These inventions relate to processor design, and more specifically to allocation of function units in processor design, such as for systolic processors and application specific integrated processors (ASIPs).

RELATED ART

Processor design is a very time intensive and expensive process. For new and unique processor designs, no automated design techniques exist for selecting and designing the mix of processor components that would be incorporated into the final processor design. While there exist algorithms incorporated into software packages that can help in designing new processors, such software packages do not give a result which is a final design, let alone an optimal design. Typically, those software packages provide approximate solutions to a design problem, typically leading to additional design effort and over-design to account for the lack of precision in those software packages. Additionally, the design process may start entirely from scratch, which would result in substantial time being consumed analyzing possible design configurations before designing the details of the processor. On the other hand, designing a new processor using preexisting designs necessarily incorporates the design benefits and flaws of the preexisting design, which may or may not be acceptable or optimal for the new design.

All conventional processor design software packages are heuristic in nature. In other words, they rely on design criteria and/or methods that in the past have proven more effective than other criteria or methods. However, in order to apply to more than one processor design or design methodology, such design criteria and methods must be sufficiently general to provide predictable results. Therefore, such heuristic software packages provide relatively high-level solutions without a complete contribution to details of the design. Additionally, heuristic software packages necessarily lead to significant trial and error in an attempt to optimize the processor design. Consequently, design of new processors is time intensive and expensive.

Processors are often designed to incorporate pipelined data paths to speed processing throughput, reduce initiation intervals and to optimize use of the various function units, such as adders, multipliers, comparators, dividers and the like. These data paths are formed from an interconnected assembly of function units and register files. The function units and register files may be interconnected by busses. Because these data paths may include a large number of function units, register files and bus segments, the job of selecting the function units, register files and bus segments is very difficult, to say the least. The task is made more difficult if one desires to find the optimal configuration of these units having the lowest or a low cost relative to other configurations. Because of the huge number of possible configurations, it is difficult if not impossible to find optimal configurations.

Pipelined data paths are particularly useful in processing iterative instructions, such as those found in instruction loops, and especially nested instruction loops. When considering a subset of situations where the instruction loops are known, such as those used with embedded processors, the task of designing the optimal, low-cost processor still exists because of the large number of different function units, register configurations and bus configurations that are possible. Heuristic software design solutions used for designing processors are not suitable for finding solutions to such multi-dimensional problems. Because there are so many variables to consider, it is too difficult to optimize all of variables to arrive at a suitable solution without great expenditure of time and effort.

SUMMARY

The present inventions provide methods and apparatus for more easily and efficiently producing computing systems, for example those incorporating processor arrays having processor elements with function or execution units, register files, busses, and the like. These methods and apparatus reduce the time required for designing these processors, and reduce the amount of trial and error used in processor design. They also find a better combination of hardware components, as tested by one or more quantifiable parameters, than those developed using heuristic methods, leading to overall superior results. The methods and apparatus may provide solutions to function unit allocation problems, or at least a starting point for allocating function units in processor design. They also eliminate the costs associated with starting the design of a new processor from scratch, which often may be necessary in the design of embedded processors, and they allow the more time intensive design process to start later in the conventional processor design flow.

These and other aspects of the present inventions are provided by methods and apparatus for selecting operation devices or hardware components for a processor, such as for an embedded processor having pipelined data paths. The hardware components could be function units, registers, busses, or other items that could be incorporated into a processor. The apparatus can take any number of forms, including computers and other processors, such as mainframes, workstations, and the like, as well as apparatus containing instructions or data for use in controlling such processors, such as disk drives, removable storage media, and temporary storage. In one aspect of the present inventions, the process includes identifying a set of hardware components, such as function units, and a plurality of characteristics for those hardware components. A first set of characteristics may include a repertoire, such as the ability to add, subtract, multiply, and the like, and a second set of characteristics for the hardware components may include the number of cycles used for a given operation for the particular hardware component (data interval, i.e. the number of time slots or cycles in each unit of type i for an operation of type j), cost and the like. A plurality of these characteristics of the hardware components are incorporated into an algorithm, which is then solved for one or more desired parameters, such as type and number of hardware components.

In one preferred embodiment, the algorithm is an integer linear program which is loaded with a list of the set of function units available for incorporation into an embedded processor, the cost of each of the function units, the data intervals associated with the function units, as well as any other necessary data associated with the function units. The integer linear program is also preferably given one or more constraints, such as the number of each of the function units must be an integer. Other constraints include the requirement that the sum over all of the function units of the number of cycles carried out in a function unit for its operations divided by the data intervals is at least the number of operations of a given type. The integer linear program may also be given bounds such as a maximum cost for the result, or other constraints based on input from a user or designer. Integer linear programs can quickly and efficiently provide a desired solution or an approximation to a solution. Where the result is a desired solution, the result can be used to design a complete processor and provide sufficient information to produce a hardware description expressed in a hardware design language such as VHDL. Where the result is an approximation to a solution, the designer can use that result to more quickly design a processor according to the defined design criteria for the processor.

Integer linear programs are particularly useful for providing solutions to multi-dimensional problems, and are particularly appropriate for allocating function units in processor elements of synchronous processor arrays. The possible combinations of function units are so numerous that optimal selection of function units for a particular processor design may be effectively impossible. This is especially the case with multi-function function units, where because of a particular combination of operations a multi-function function unit would serve better than a number of discrete function units carrying out the same operations. Algorithms used to solve an integer linear program are well known and produce reliable results.

In a further preferred form of the invention, the integer linear program is configured to minimize cost of the function units while still ensuring that all operations for a given set of instructions within a loop are included. Using an integer linear program to minimize cost is especially attractive for allocating function units in an embedded processor using data pipelining. Embedded processors will be carrying out predefined operations, many of which will be repetitive loop operations. Consequently, there is not as much flexibility necessary in the function units to accommodate a variety of different operations. Thus, the focus in solving the integer linear program may be on minimizing the cost of the allocation of function units knowing that a number of different function unit combinations are available for carrying out any given set of operations. While parameters other than cost can be optimized, minimizing cost for embedded processors is particularly attractive in view of the expected proliferation of embedded processors in equipment, appliances and other apparatus.

In another form of the inventions, an upper bound on the cost may be input to the integer linear program. Such additional input or constraint effectively limits the number of possible solutions to the integer linear program. If a given constraint would be violated by a particular set of combinations, the integer linear program can easily eliminate such combinations without otherwise testing whether or not the particular set of combinations meet all other criteria. Other constraints can also be imposed on the integer linear program based on heuristics known to the designer.

DETAILED DESCRIPTION

The inventions, some of which are summarized above, and defined by the enumerated claims may be better understood by referring to the following detailed description, which should be read in conjunction with the accompanying drawings. This detailed description of a particular preferred embodiment, set out below to enable one to build and use one particular implementation of the invention, is not intended to limit the enumerated claims, but to serve as a particular example thereof. The particular examples set out below are the preferred specific implementations of the function unit allocation system that can be used for a number of applications and implemented in a number of ways. The inventions, however, may also be applied to other systems as well.

In accordance with several aspects of the present inventions, apparatus and methods are disclosed for selecting hardware components for a processor such as an embedded processor which decreases the time and effort required for processor design. The methods and apparatus also reduce the amount of trial and error used during processor design, and produces a more predictable and definitive result than generic heuristic methods. The methods and apparatus also provide a starting point for final allocation of function units in embedded processors, especially those using pipelined data flow, and may even produce acceptable designs without any need for additional design work for allocating function units. Even if further design work is desired, the result from the apparatus and methods described herein provide a desirable starting point for further design work. Consequently, these methods and apparatus significantly reduce the cost of design. These methods and apparatus also can be used to produce an embedded processor design that has the least cost for carrying out a defined set of operations.

The term "cost" is used herein to represent a measurable quantity corresponding to the hardware component. In the most basic sense, it means the cost of inserting the hardware component into the processor, including the number of switches and the layout for each component. In a more general sense, it may also mean the cost in power consumption during operation of the processor. Alternatively, the cost may be in terms of the amount real estate or chip area occupied by the component. Similarly, the cost could be a combination of these and/or other quantities, applied with or without desired weights. Therefore, cost refers to one or more quantifiable attributes of the hardware components.

In one aspect of the present inventions, the methods can be carried out on a pre-programmed digital processor, a general-purpose computer or a workstation, such as at 20 (FIG. 1), which can receive input from a conventional keyboard 22. The input can take the form of input data for use by algorithms processed by the computer 20, constraints to be placed on the processing of the algorithm by the computer, or other input or information as necessary. Information such as intermediate results, queries, requests for input, final results or other information can be displayed by the computer on a monitor 24 or output, as desired.

Figure 1:
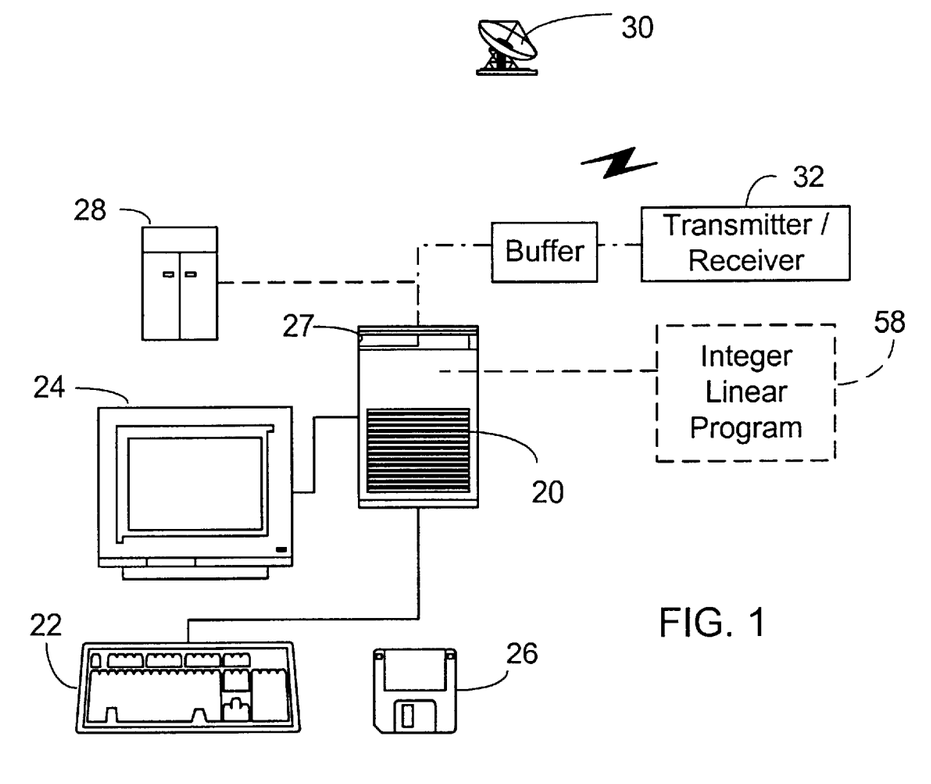
FIG. 1 is a schematic and assembly drawing of an apparatus for selecting hardware components for a processor such as an embedded systolic processor, including apparatus for receiving input to and delivering results from the selection process.

The computer 20 can receive applications programs and/ or data from a number of different sources, including a removable storage device such as disk 26 for a disk drive 27 or any other movable tangible storage medium, such as portable disk drives and the like. Applications programs and data can also be received from a network host, host processor or mainframe computer 28, or from more remote locations such as off-site servers, over the Internet, or through other conventional communications paths. For example, data can be received from a satellite antenna 30 through a transmitter receiver 32 linked to an input and output port on the computer 20. Other linkages and communications methods can be used with the computer 20 in order to receive data and software, and to transmit data, results and software.

Figure 2:
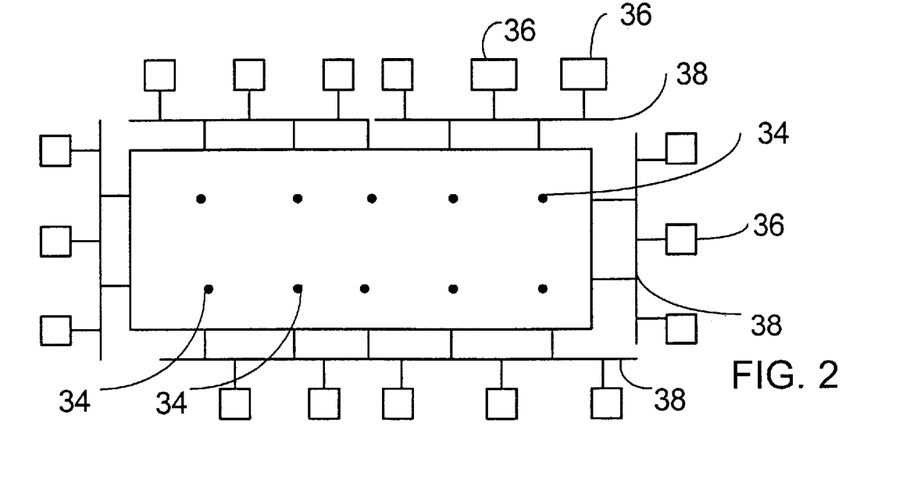
FIG. 2 is a schematic diagram of a processor such as a pipelined processor that may be designed in accordance with the apparatus and methods of the present inventions.

Particular applications to which the present inventions are directed include designing processors such as embedded processors. Embedded processors are used extensively as controllers or processors for equipment, appliances, entertainment devices, and the like. These processors have predefined functions and operations, and many of the operations are repetitive. These repetitive operations, by their nature, lend themselves to being carried out on function units depicted schematically at 34 (FIG. 2) using register files 36 all arranged in such a way as to move incoming data and transfer the results of operations along a path termed a "pipeline". The pipeline arrangement takes advantage of the natural flow of data through the operations while minimizing register load requests and data transfers. Buses 38 may be used to interconnect the function units 34 and the register files 36. The present inventions can be used to quickly and inexpensively optimize the design of such embedded processors. While the following discussion will focus on embedded processors and their design, with particular emphasis on assemblies of function units, register files and buses configured to optimize data pipelining, it should be understood that the inventions described herein may be applicable to the design and manufacture of other processor configurations.

Processors operate based on instructions from a software program or other instruction source. Part of that software program or other instruction source may include a loop body or loop nest represented in FIG. 3 by the sample routine 40. This sample routine would be part of a larger software program or other instruction source, but serves in this instance as a suitable example of a set of calculations that can be carried out on an embedded processor, such as one including an ensemble of function units, register files and possibly buses forming a pipelined data path. The sample routine may include an add operation 42, a multiply operation 44 and an add operation 46 within a loop 48, which in turn is nested within a loop 50. This loop nest can be evaluated and considered along with other requirements to determine possible Initiation Intervals (II) according to which the operations would be carried out on various function units. Initiation Interval may take into account the cycle time required by the equipment or appliance into which the computing unit will be placed. For example, the Initiation Interval may depend at a macro level on the number of pages to be scanned per second in a scanner, the number of sheets to be output per minute by a printer or copier, and the like. It also may depend on a micro level on such factors as recurrences and the like. Using this information, the mix of function units will be determined, in accordance with one aspect of the present inventions. If a suitably small initiation interval can be selected, a combination of function units can be selected that will carry out the operations defined by the software routine in a sufficiently small amount of time, and the selected function units are efficient and sufficiently low-cost to reduce the cost of the overall processor. One preferred approach for doing so is described herein.

By way of example, a simple operation will be described to demonstrate the process for using the initiation interval of a sample routine of FIG. 3 to start designing part of the processor. Initiation interval is the number of cycles between the start of one operation of a loop iteration and the start of the next iteration of loop for the same operation, in other words the number of cycles between successive iterations of the loop. The sample routine can be converted into an equivalent sample routine depicted as 52 in FIG. 4. The instruction level sample routine 52 identifies the cycle times over which the operations of the inner loop nest 48 could be carried out on possible function units, such as an adder 54 and a multiplier 56. Other combinations of function units are possible, but this combination serves as a simple example. Analyzing this instruction level sample routine, for example, may lead to a selection of an initiation interval of II=4. While it should be understood that other initiation intervals can be selected for the sample routine 40 and the instruction level sample routine 52, this initiation interval will be used as a starting point for this example.

Figure 4:
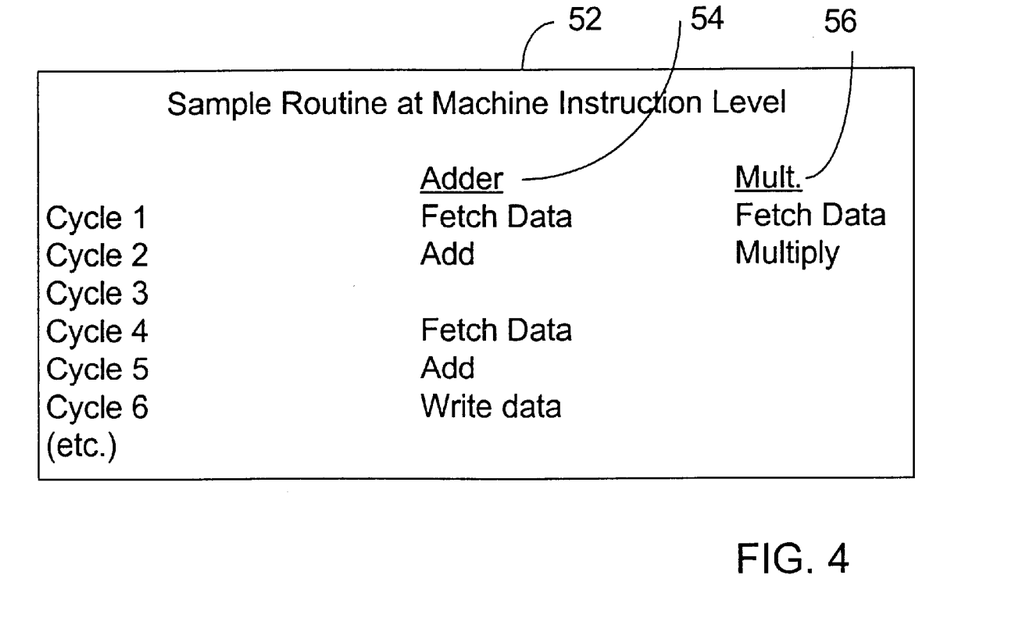
FIG. 4 is a schematic of a machine instruction level sample routine derived from the software routine of FIG. 3.

Given an instruction level sample routine 52 and an initiation interval II, there are numerous function unit combinations that could be used to execute the operations defined by the sample routine 40 and instruction level sample routine 52 and which would have the initiation interval II. It should be understood that while many function unit combinations could be used in the end processor, it is also valuable to optimize one or more parameters about the computing unit, such as finding the least cost combination of function units that could be incorporated in the processor being designed. In accordance with one aspect of the present inventions, an integer linear program 58 (FIG. 1) is used to find a solution to the optimization problem of identifying the desired function units having the desired characteristics to execute the instruction level sample routine in the desired manner. It can be used for selecting function units to be incorporated into the desired processor, and it can do so based on a number of criteria, including characteristics about the function units, such as cost, through put, and the like. The integer linear program can be used to for evaluating the hardware components and to select which ones best suit the purpose at hand. There are a number of algorithms which can be used to solve integer linear programs, and in one preferred embodiment, the routine known as CPLEX, marketed by ILOG, can be used to do so. The function units are adders, multipliers, arithmetic logic units, registers, busses, or the like, and their desired characteristics are lowest cost and data intervals that will allow the resource-based minimum initiation interval to be less than or equal to the defined initiation interval, II=4 in the given example. This information along with various criteria are then recast into an integer linear program which can be solved by the desired algorithm.

Figure 5:
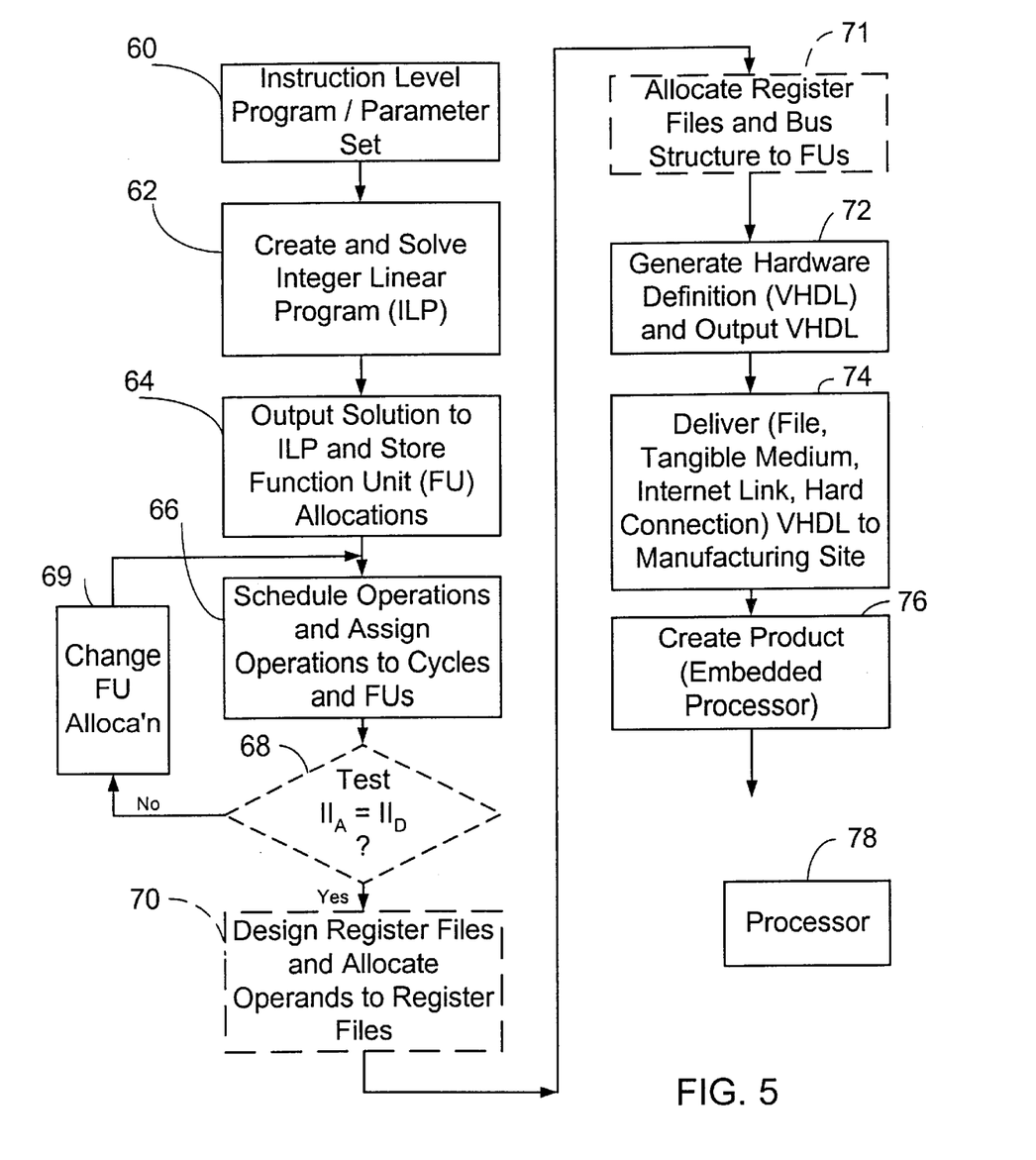
FIG. 5 is a flow chart depicting a process for selecting hardware components for a processor in accordance with one aspect of the present inventions.

In one preferred embodiment of the inventions, a general-purpose computer, workstation or other processor 20 (FIG. 1) may accept as input an instruction program and parameter set 60 (FIG. 5). This information may be input from a keyboard 22, a removable storage medium 26, from a mainframe 28 or from a communications link. The instruction program and parameter set may include the initiation interval or a similar criterion, and a library of information about the function units or other components to be selected for inclusion in the final processor. The processor 20 will also include, already loaded or retrieved from another source, an algorithm, such as CPLEX, or the like, for solving an integer linear program. The processor 20 then creates and solves the integer linear program in step 62 using the instruction program and parameter set provided from step 60. The solution to the integer linear program is output at step 64 to memory, to the removable storage medium 26, the mainframe 28 or to a receiver over a communications link. Where the integer linear program is used to solve for the least cost set of suitable function units, the processor 20 outputs the list or vector of function units whose combination fits the criteria input to the integer linear program.

Figure 3:
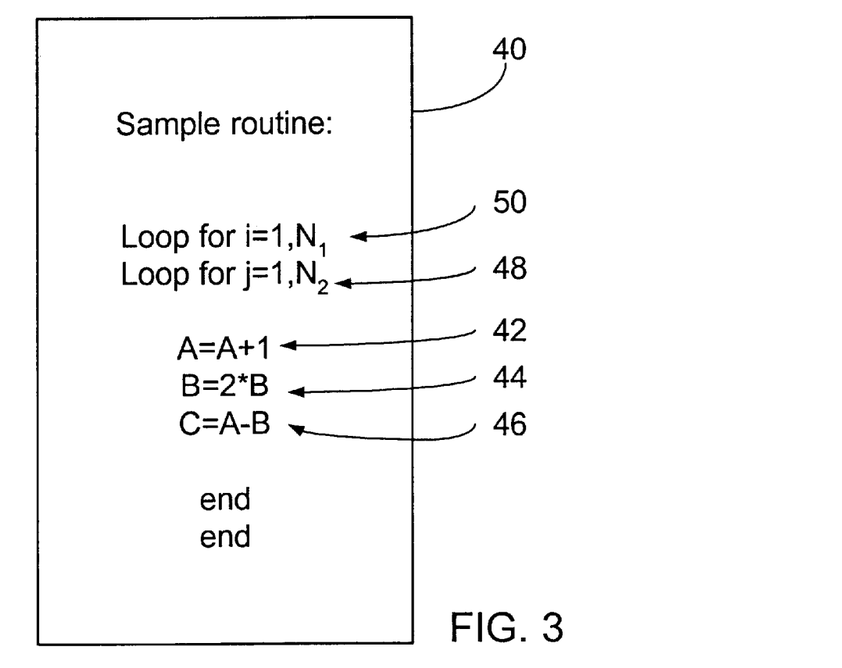
FIG. 3 is a schematic of a sample software routine segment that may be executed in a processor designed using the designs and methods of the present inventions.

A conventional scheduling program such as a modulo scheduler schedules the operations and assigns operations to cycles and to the function units based on the instruction level sample routine 52 (FIG. 4), as represented at 66 in FIG. 3. The modulo scheduler can then test the allocation of the function units and the operations at step 68 to see whether the function units can carry out the required operations with an initiation interval less than or equal to the initiation interval II=4, in other words if the actual IIa is equal to the desired lid. If successful, the processor 20 can design register files and allocate operands to register files at step 70, and it can also allocate register files and bus structure to function units at step 71. These steps at 70 and 71 can be carried out using a conventional heuristic algorithm or by using an integer linear program in a similar manner as was done for the function units but by treating a bus structure as a function unit and a data transfer as an operation. If not successful, the function unit set or mix found by the integer linear program can be adjusted at step 69 by adding and/or substituting function units, as more fully described below, after which step the modulo scheduler can then repeat step 66 until the desired mix is found. If the bus and register files are determined separately, as in steps 70 and 71, additional tests can be done to see if the desired mix is found. If the desired mix is not found, the system returns to step 70. If it is found, the system continues.

Thereafter, the processor 20 or another suitable apparatus generates a hardware definition language at step 72, such as VHDL, and outputs the hardware definition language so that it can be delivered, at step 74, to a manufacturing site. The manufacturing site then creates at step 76 a suitable product such as an embedded processor 78 which incorporates the function units and bus structure, or other linkage between the function units and register files, suitable to execute the instruction level sample routine.

An integer linear program is a preferred algorithm because it has known characteristics and is capable of solving multidimensional problems. In the present example, the multidimensional problem is to select a number of computation devices or hardware components such as function units from among a library of function units, each function unit having a first characteristic such as the ability to add, subtract, multiply, compare, divide, take the absolute value, transfer data, store data, etc. This library of function units is substantial, given the number of multi-function function units, such as arithmetic logic units, and the like that are now available. These function units also have a second characteristic including cost, and other characteristics such as data interval and other attributes that may be selected or optimized. The number and variety of function units is quite large. Therefore, the selection of function units to be used to execute the operations defined by the instruction level sample routine is a complicated multi-dimensional problem. The integer linear program can be solved by conventional software algorithms, the solution of which includes the function unit ensemble that provides the desired resource-based minimum initiation interval and has the least cost of all such possible ensembles. In addition, the cost of the function unit ensemble obtained from the integer linear program provides the designer with a useful lower bound on the cost of the least expensive function unit ensemble that can achieve the desired initiation interval.

In the preferred embodiment, the register files and the operands are designed and allocated as function units in steps 64 and 66. Likewise, the bus structure is allocated between the register files and the function units in the same manner. It is as efficient to combine these steps as part of the original integer linear program as to do them separately, or without using an integer linear program at all. When combined into one larger process, the steps at 70 and 71 are collapsed into 64 and 66, and the test at 68 is of the complete mix of potential hardware components as determined from the output of the algorithm.

In the preferred embodiment, the instruction level sample routine will be used to find an initiation interval 11. The initiation interval is one of the input values for the integer linear program. The other values or parameters that are used to create the mixed integer linear program include the library of function units and their known characteristics, which are then used to design criteria into the integer linear program, as discussed more fully below with respect to the method depicted in FIG. 6.

Figure 6:
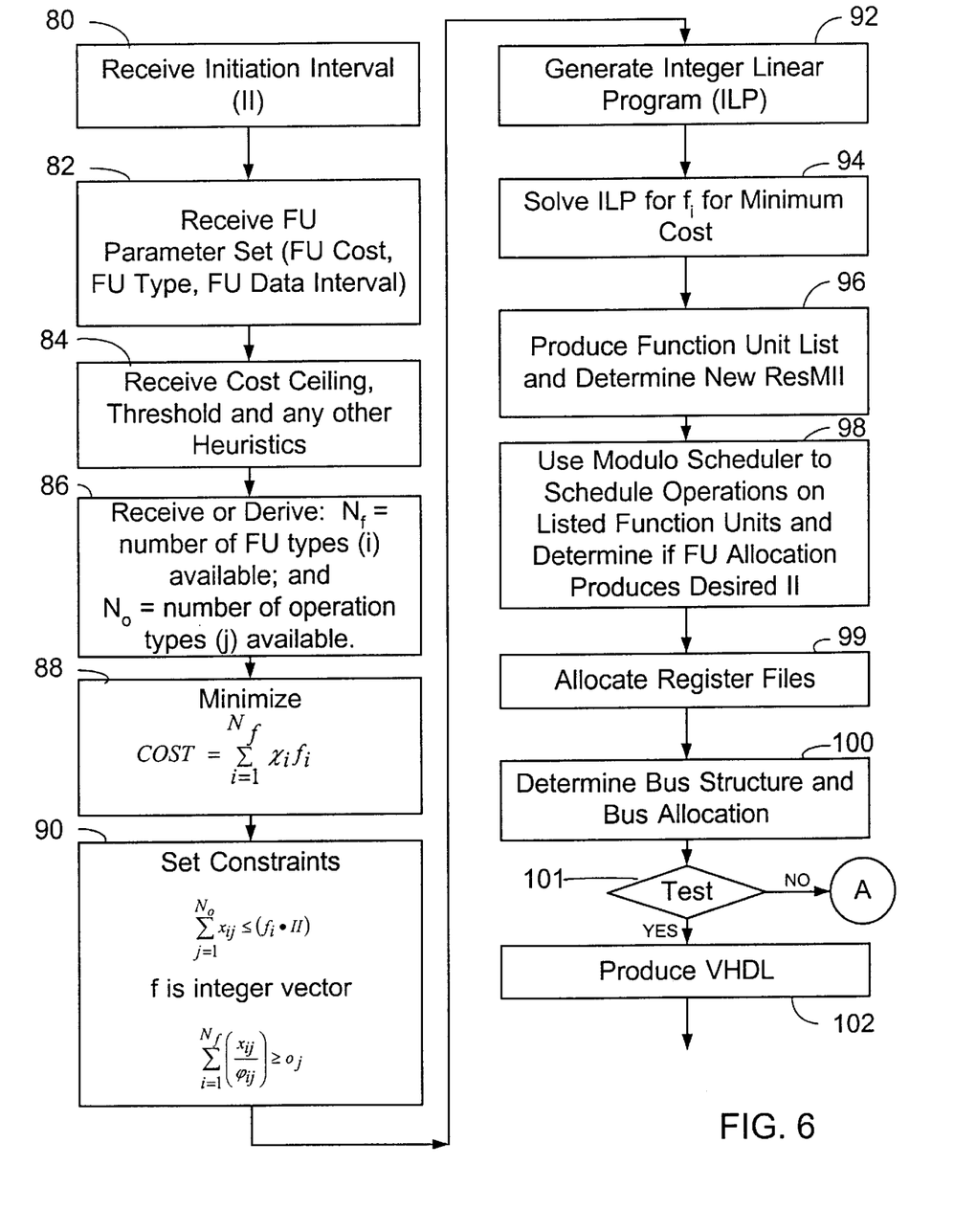
FIG. 6 is a detailed flow chart depicting one process for selecting hardware components for a processor using an integer linear program.

As shown in FIG. 6, the system generates a mixed integer linear program with an initiation interval at step 80 and a function unit parameter set 82. These data may come from memory or a suitable input or other conventional source. The system, loaded with the algorithm to solve the integer linear program, also uses other parameters or constraints such as a cost ceiling provided at 84 and any other constraints which may come from empirical information, heuristics or other knowledge of processor design. For example, the cost ceiling may come from a general knowledge of costs of current embedded processors, or the like. Providing a cost ceiling, and even a multiple of a reasonable cost ceiling provides useful information for the integer linear program to minimize the possibility that the program follows potential solution paths that empirically are unreasonable.

The system is also provided with or calculates at 86 $N_f$, which is the number of function unit types available, as determined by the library of function units. $N_f$ may also be predefined as one of the parameters associated with the library of function units. The system is also provided with or calculates $N_o$, which is the number of operation types that need to be scheduled, based on the understanding of the instruction level sample routine on which the function units will operate. In order to find the least cost assembly of function units, the Cost is minimized at step 88, where Cost is determined from the following relationship:

$$COST = \sum_{i=1}^{N_f} \chi_i f_i$$

where:
$N_f$=the number of different types of Function Units available;
$X_i$=the cost incurred by using the Function Unit i;
$f_i$=the number of Function Units of type i needed to carry out the operations required by the software steps (an integer);

The Cost is minimized using several constraints or inequalities taken into consideration by the integer linear program. The first constraint is the number of cycles in a given function unit of type "i" for operation "j". Specifically, $$\sum_{j=1}^{N_o} x_{ij} \leq (f_i \cdot II)$$

$N_o$=the number of operation types to be scheduled for carrying out the software steps required;
$x_{ij}$=number of cycles in function units of type i for operations of type j, greater than or equal to zero.
II=the desired initiation interval for the assembly or subassembly of Function Units.

This first inequality states that there must be enough time or cycles represented by the function units in the subject iteration to carry out all of the desired operations.

A further constraint is that f, the function unit mix, is an integer vector. Another inequality makes the number of cycles devoted to a particular operation in the iteration greater than or equal to the number of that type of operation in the iteration. Specifically, $$\sum_{i=1}^{N_f} \left( \frac{x_{ij}}{\varphi_{ij}} \right) \geq o_j$$

Here,
$\varphi_{ij}$=the data interval or number of time slots or cycles in each unit of type i for an operation of type j; and
$o_j$=the number of operations of type j to be scheduled for the iteration.

It should also be understood that the x's and the f's are non-negative. It can also be seen that the number of inequalities is the number of operation types plus the number of function unit types. Additionally, the number of unknowns is the product of the number of operation types and the number of function unit types, namely, the x's, plus the number of function unit types, namely, the f's.

It is appreciated that a solution to the algorithm may not give a complete solution to the design problem. However, it is certain that the solution to the integer linear program using these inequalities will lead to a resource-based minimum initiation interval which is less than or equal to the defined initiation interval, and it is believed that it will produce a function unit ensemble close to a desired solution as well as a lower bound on the least possible cost of the desired solution.

These data, parameters and inequalities are then used to create the integer linear program at step 92, which is then solved using CPLEX or some other algorithm at step 94 to produce the ensemble of function units having a least cost and a resource-based minimum initiation interval less than or equal to the defined initiation interval. The processor 20 then produces, at step 96, a function unit list and determines a new resource-based minimum initiation interval. An algorithm such as a modulo scheduler is used to schedule operations on the listed function units and determine if the function unit allocation produces the desired processor configuration having the desired initiation interval (step 98). In the example where the function units include the registers and busses, the hardware description language is generated if a successful mix is found. If not, the system branches to "A" (FIG. 7), where adjustments can be made to the function unit mix. In the example where the function units do not include the registers and busses, branch "A" is taken if the function unit allocation mix does not produce the desired initiation interval, and then returns to step 98. If the mix produces the desired initiation interval, the system continues.

Register files are allocated (step 99) and a bus structure is defined and allocated to the function units and the register files in the conventional manner, or in accordance with an integer linear program created where the function units are buses, at step 100. The mix is then tested at 101, and if successful, a hardware description language can then be produced at step 102 using any one of a number of conventional techniques or algorithms.

Figure 7:
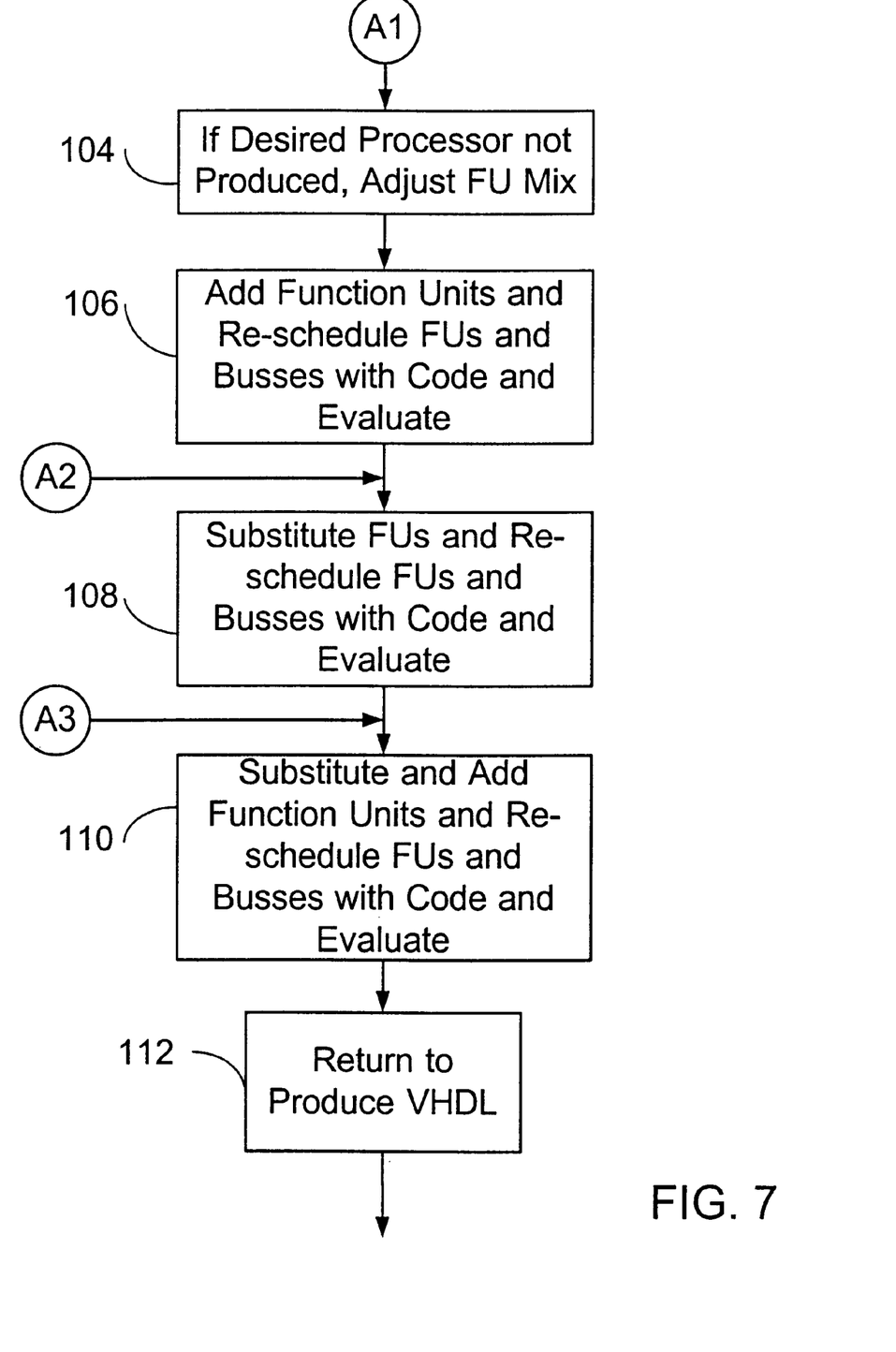
FIG. 7 is a flow chart depicting a process for evaluating the results derived from an integer linear program to see if those results represent a complete solution to a function unit allocation problem.

If the function unit allocation does not produce the desired processor configuration at step 98, or in the case of separate register and bus definitions, at step 101, the function unit ensemble or mix can be adjusted (step 104, FIG. 7). FIG. 7 is a schematic representation of types of adjustments that could be made if desired. It does not represent any particular order for the adjustments or testing. The entry point for branch "A" can be at any desired location along the chain in FIG. 7 and need not follow any particular order. Possible entry points include A1, A2 and A3, depending on whether the intended process is to add function units ("A1"), substitute function units ("A2") or both ("A3"). Once the mix is changed, it is re-evaluated to see if the mix produces the desired initiation interval. For example, the system can enter at "A1" and add function units (step 106). The new function unit mix is then rescheduled or re-assigned with the buses and with the instruction level sample routine and the combination is re-evaluated to see if the new ensemble of function units carries out all the required operations in such a way that the initiation interval is less than or equal to the defined initiation interval. If successful, the hardware description language can be produced, as at step 102. If not successful, other function units can be substituted in and the new ensemble rescheduled and the function units assigned according to the instruction level sample routine and reevaluated (step 108). If successful, the hardware description language is produced. If not, additional function units can be added and/or others substituted and the new ensemble rescheduled and evaluated with the buses and the required instruction level sample routine as before (step 110). The processor 20 then returns to produce the hardware description language (112).

Even if the first solution to the integer linear program is not a complete solution, it is believed that it provides a close approximation, and saves a substantial amount of time and design effort relative to having to start from scratch. The use of the integer linear program helps solve the multi-dimensional function units selection problem and speeds the selection of a low-cost function unit mix that can be used to carry out the required operations with the desired initiation interval.

The mixed integer linear program decreases the time and effort required for processor design, and reduces the amount of trial and error used in processor design, especially for embedded processors or computing systems. Conventional algorithms can be used to solve the integer linear program and their solution is the best or least cost assembly of hardware components than can be designed to carry out the required program in the desired initiation interval than can be found using heuristic methods. It provides the desired low-cost function unit mix or a beneficial starting point for determining the desired function unit mix. The use of the integer linear program eliminates a cost associated with starting from scratch and provides a better starting point than would otherwise exist.

Having thus described several exemplary implementations of the invention, it will be apparent that various alterations and modifications can be made without departing from the inventions or the concepts discussed herein. Such operations and modifications, though not expressly described above, are nonetheless intended and implied to be within the spirit and scope of the inventions. Accordingly, the foregoing description is intended to be illustrative only. For example, it should be understood that finding a least cost collection of function units is one preferred goal, and it is possible to instead or in addition maximize a value for the combination. While in the manufacturing sense this could be viewed as maximizing the savings in production (the converse of cost), but there could also be positive attributes of a hardware component that one wishes to promote in the final design. Therefore, optimization in the present invention includes maximizing a positive feature as well as minimizing a negative or otherwise less desirable feature.

APPENDIX

The following appendix is an unpublished paper provided as part of this application, incorporated herein by reference.

Robert Schreiber, *Optimum Function Unit Allocation via Generalized Bin Packing and Mixed Integer Linear Programming*.

I claim:

1. A method for selecting hardware components for a processor, the method comprising:
   receiving a description of a set of hardware components having one or more characteristics;
   receiving at least one of the one or more characteristics for use in evaluating a combination of the hardware components;
   creating an integer linear program using the one or more characteristics of the hardware components in the set of hardware components and constrained by the combination of hardware components having a lowest cost and predicted not to exceed a maximum initiation interval while performing an iteration of a routine;
   solving the integer linear program for selecting the combination of hardware components to be included in the processor;
   scheduling instructions on the combination of hardware components associated with the routine using a scheduler; and
   modifying the combination of hardware components when the initiation interval associated with the scheduled instructions exceeds the maximum initiation interval.

2. The method of claim 1, further comprising:
   producing a list of hardware components for use in the processor and identifying the hardware components by computation type and data interval.

3. The method of claim 2, wherein producing a list further includes creating a hardware description language corresponding to the list.

4. The method of claim 1, wherein receiving a description of a set of hardware components includes identifying at least two devices from components that can add, multiply, compare, and wherein the devices have characteristics that include cost, data interval and number of functions.

5. The method of claim 1, wherein receiving at least one of the one or more characteristics includes identifying a cost of including a hardware component in a processor and identifying a data interval.

6. The method of claim 5, wherein creating and solving further includes minimizing the cost of the hardware components.

7. The method of claim 6, further including defining boundaries on the integer linear program.

8. The method of claim 7, wherein defining the boundaries further includes defining an upper boundary for a total cost of the hardware components identified on the list.

9. The method of claim 1, further comprising creating a library with representations of information identifying which operations occur on a particular hardware component.

10. A processor including hardware components wherein the components are made according to claim 1.

11. A method for selecting hardware components for a processor, the method comprising:
    receiving a description for a set of hardware components having one or more characteristics including an ability to add, subtract, multiply, and a cost for each hardware component as a function of the one or more characteristics;
    receiving the cost as one of the one or more characteristics for use in evaluating a combination of the hardware components;
    creating an integer linear program using the one or more characteristics of the hardware components in the set of hardware components and constrained by the combination of hardware components having a lowest cost and predicted not to exceed a maximum initiation interval while performing an iteration of a routine;
    solving the integer linear program to obtain the minimum cost assembly of hardware components and select the combination of hardware components to be included in the processor according to the constraints; and
    producing a list of hardware components for use in the processor.

12. The method of claim 11, wherein receiving a set of hardware components includes identifying a set of hardware components that include registers and bus elements.

13. A system for selecting hardware components for use in a processor, the system comprising:
    a computation system including a processor and memory in which is stored data and a solver for solving an integer linear program constrained by a combination of hardware components having a lowest cost and predicted not to exceed a maximum initiation interval while performing an iteration of a routine, wherein the processor accesses the memory for executing the solver and processing the data to determine a solution to the solver, and wherein the combination of hardware components are modified when instructions scheduled on the hardware components by a scheduler exceed an initiation interval while processing an iteration associated with the routine;
    means for accepting input data wherein the input data includes a value representing an initiation interval for a processor to be designed by the system; and means for producing output data representing hardware components to be incorporated into a processor.

14. The system of claim 13, wherein the means for accepting input data includes means for accepting data representing hardware components and cost values representing a cost of incorporating each hardware component into a processor.

15. The system of claim 13, wherein the means for accepting input data includes means for accepting data representing code representing a program language that would be executed on a processor having the hardware components represented by the data produced by the means for producing output data representing hardware components.

16. The system of claim 13, wherein the computation system memory includes a database of hardware component characteristics including hardware component cost, hardware component throughput, and hardware component types.

17. The system of claim 16, wherein the hardware component characteristics include characteristics of adders and registers, and further includes data representing costs for each component characteristic.

18. A processor made according to the system of claim 13.

19. A process for generating a description language of a new processor, the process comprising:

receiving input in a computing machine including data representing a desired performance value of the new processor, data representing operations to be performed by a routine on the new processor, and data representing hardware components and hardware component characteristics that are included in processors;

receiving a solver in the computing machine for solving integer linear program problems;

receiving data representing criteria for defining an integer linear program constrained by a combination of hardware components having a lowest cost and predicted not to exceed a maximum initiation interval while performing an iteration of a routine;

solving the integer linear program using the solver to produce the combination of the hardware components that are used to build the new processor; and modifying the combination of hardware components when instructions associated with the routine are scheduled to execute on a subset of hardware components and a corresponding initiation interval exceeds the maximum initiation interval.

20. The process of claim 19, wherein receiving data representing criteria includes receiving data and a defined relationship for finding a least cost assembly of hardware components for the new processor.

21. The process of claim 19, wherein receiving data representing hardware components includes receiving data for registers and bus structures.

* * * * *